(12) United States Patent
Avary et al.

(10) Patent No.: US 10,373,403 B2
(45) Date of Patent: *Aug. 6, 2019

(54) AUTOMATIC CONNECTED VEHICLE SUBSEQUENT OWNER ENROLLMENT PROCESS

(71) Applicant: Aeris Communications, Inc., San Jose, CA (US)

(72) Inventors: Michelle Lynne Avary, Menlo Park, CA (US); Henry Plager, Mountain View, CA (US)

(73) Assignee: Aeris Communications, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/895,152

(22) Filed: Feb. 13, 2018

(65) Prior Publication Data

US 2018/0174376 A1 Jun. 21, 2018

Related U.S. Application Data

(63) Continuation-in-part of application No. 14/927,285, filed on Oct. 29, 2015.
(Continued)

(51) Int. Cl.
| | | |
|---|---|---|
| *H04W 60/06* | (2009.01) | |
| *H04W 4/70* | (2018.01) | |
| *H04W 60/00* | (2009.01) | |
| *G07C 5/00* | (2006.01) | |
| *G11C 7/20* | (2006.01) | |

(Continued)

(52) U.S. Cl.
CPC ............. *G07C 5/008* (2013.01); *G11C 7/20* (2013.01); *H04W 4/40* (2018.02); *B60W 2050/0082* (2013.01); *B60W 2050/0083* (2013.01)

(58) Field of Classification Search
CPC ..... H04W 4/005; H04W 12/02; H04W 60/06; H04L 63/08; H04L 63/10; H04L 67/306; G06Q 30/0185
See application file for complete search history.

(56) References Cited

U.S. PATENT DOCUMENTS

| | | |
|---|---|---|
| 5,635,693 A | 6/1997 | Benson et al. |
| 6,868,389 B1 | 3/2005 | Wilkins et al. |
| (Continued) | | |

OTHER PUBLICATIONS

PCT International Search Report and Written Opinion of the International Searching Authority, dated May 20, 2016, application No. PCT/US2015/58411.
(Continued)

*Primary Examiner* — Dominic E Rego
(74) *Attorney, Agent, or Firm* — Brundidge & Stanger, P.C.

(57) ABSTRACT

The present invention is directed toward an automatic connected vehicle subsequent owner method and system for automatically wiping personal data from the vehicle, transitioning remote services access to a subsequent owner, and delinking the vehicle from their smartphone or other interactive communication link. In one more embodiments, a computer implemented method provides for delinking customers and deregistering vehicles from original owners where those vehicles have been subsequently sold, discontinued, or otherwise transferred for the customer's ownership.

26 Claims, 9 Drawing Sheets

Related U.S. Application Data

(60) Provisional application No. 62/073,667, filed on Oct. 31, 2014.

(51) Int. Cl.
*H04W 4/40* (2018.01)
*B60W 50/00* (2006.01)

(56) References Cited

U.S. PATENT DOCUMENTS

| | | | |
|---|---|---|---|
| 7,126,457 B1 | 10/2006 | van Schalkwyk Fourie et al. | |
| 8,588,991 B1 | 11/2013 | Forbes, Jr. | |
| 8,868,458 B1 | 10/2014 | Starbuck et al. | |
| 2002/0152238 A1* | 10/2002 | Hayes | G06F 17/30855 715/240 |
| 2002/0186144 A1 | 12/2002 | Meunier | |
| 2003/0200406 A1 | 10/2003 | Kouno | |
| 2005/0132024 A1* | 6/2005 | Habaguchi | G06Q 10/063 709/219 |
| 2005/0139664 A1* | 6/2005 | Yamagiwa | G06Q 30/02 235/385 |
| 2005/0283284 A1 | 12/2005 | Grenier et al. | |
| 2006/0003762 A1 | 1/2006 | Sumcad et al. | |
| 2007/0282738 A1 | 12/2007 | Highbloom | |
| 2008/0203145 A1 | 8/2008 | Martins | |
| 2008/0228346 A1 | 9/2008 | Lucas et al. | |
| 2008/0231446 A1 | 9/2008 | Cresto | |
| 2009/0089069 A1 | 4/2009 | McKibbon | |
| 2009/0112394 A1 | 4/2009 | Lepejian et al. | |
| 2009/0177336 A1 | 7/2009 | McClellan et al. | |
| 2009/0195370 A1 | 8/2009 | Huffman et al. | |
| 2010/0076801 A1 | 3/2010 | Ku | |
| 2011/0119614 A1 | 5/2011 | Powell et al. | |
| 2012/0039212 A1 | 2/2012 | Kaliyaperumal et al. | |
| 2012/0142367 A1 | 6/2012 | Przybylski | |
| 2012/0252407 A1 | 10/2012 | Poltorak | |
| 2013/0254469 A1* | 9/2013 | Miyake | G06F 8/654 711/103 |
| 2013/0305323 A1 | 11/2013 | Kleve et al. | |
| 2014/0159866 A1* | 6/2014 | Hwang | G08C 17/02 340/5.64 |
| 2014/0200737 A1 | 7/2014 | Lodz et al. | |
| 2014/0344014 A1 | 11/2014 | MacInnis | |
| 2014/0365160 A1* | 12/2014 | Steffen, II | B61L 27/0055 702/122 |
| 2015/0045983 A1 | 2/2015 | Fraser et al. | |
| 2015/0100506 A1 | 4/2015 | Binion et al. | |
| 2015/0260529 A1* | 9/2015 | Petersen | G01C 21/26 701/522 |
| 2015/0266377 A1* | 9/2015 | Hampiholi | B60K 35/00 455/466 |
| 2015/0286994 A1 | 10/2015 | Elder | |
| 2016/0071137 A1* | 3/2016 | Sundaresan | G06Q 30/0205 705/7.34 |
| 2016/0127373 A1 | 5/2016 | Avary et al. | |

OTHER PUBLICATIONS

PCT International Search Report and Written Opinion of the International Searching Authority, dated Mar. 2, 2016, application No. PCT/US2015/58347.

PCT International Search Report and Written Opinion of the International Searching Authority, dated Feb. 12, 2016, application No. PCT/US2015/58395.

* cited by examiner

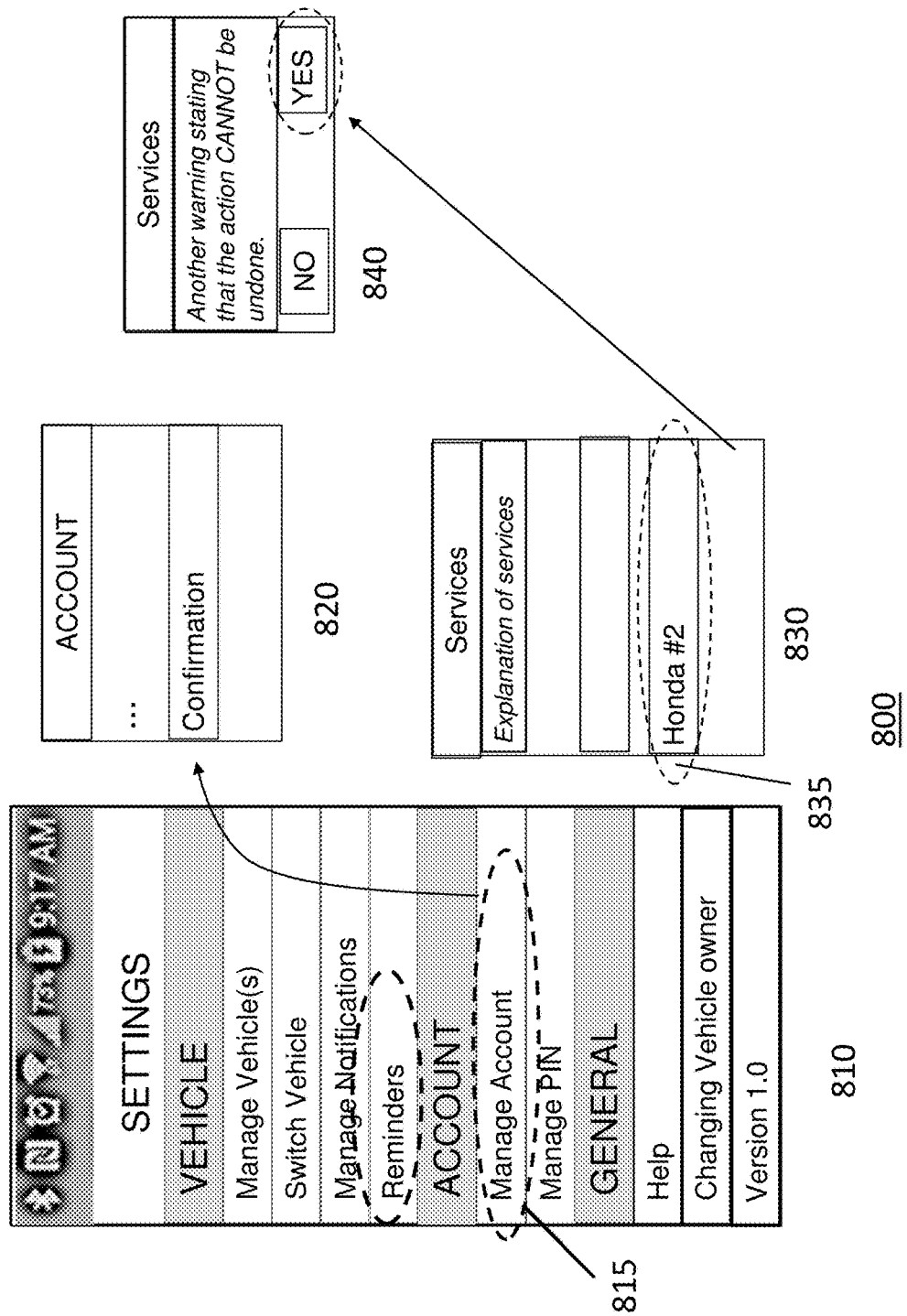

AUTOMATIC CONNECTED VEHICLE SUBSEQUENT OWNER ENROLLMENT PROCESS

CROSS-REFERENCE TO RELATED APPLICATIONS

This application is a continuation-in-part of U.S. patent application Ser. No. 14/927,285, filed on Oct. 29, 2015, entitled "AUTOMATIC CONNECTED VEHICLE SUBSEQUENT OWNER ENROLLMENT PROCESS" which claims benefit under 35 USC 119(e) of U.S. Provisional Patent Application No. 62/073,667, filed on Oct. 31, 2014, entitled "AUTOMATIC ENROLLMENT AND METHODS OF USE," and is related to U.S. patent application Ser. No. 14/927,221, filed on Oct. 29, 2015, entitled "AUTOMATIC CONNECTED VEHICLE ENROLLMENT," and U.S. patent application Ser. No. 14/927,258, filed on Oct. 29, 2015, entitled "AUTOMATIC CONNECTED VEHICLE DEMONSTRATION PROCESS," all of which are incorporated herein by reference in their entireties.

FIELD OF THE INVENTION

The present invention is directed toward automotive communication services and more particularly to a method and system for providing notification of subsequent ownership of connected vehicles.

BACKGROUND

In the transportation industry, various vehicle services are often offered to users of vehicles to enhance their experience with the vehicle. Familiar services now include a variety of software and application-based services, in varied forms, some of which are for free and other which require a subscription or fee-based model. Example of such services include enabling users to connect their smart phones to the vehicles audio system, providing turn-by-turn directions through in-car, on-screen applications, and receiving emergencies services such as unlocking a vehicle's door or the automated reporting of an accident. Many of these services are consumer-focused, in which they enhance the experience of using a vehicle and for some consumers, the availability of these services can be persuasive in making a buying decision for a particular car brand or model.

However, prior to or during a purchase, a salesperson's ability to successfully access the varied services available for a possible customer for a particular vehicle may influence a customer's buying decision. Further, there may be occasions after purchase in which the dealership would have a continued interest in communicating with subsequent owners of a vehicle about recalls, owner benefits and other assorted impacts which may benefit the present vehicle owner.

For instance, in many present model vehicles, there may be resident in a vehicle personal information of the owner, geopositional and geolocational activity of the owner, and other data that is unique to the owner and often consider sensitive or possibly confidential to an owner. When an owner elects to sell or otherwise transfer their vehicle, often owners and purchasers are most concerned about the financial and titling aspects of the deal to ensure that title and monies are properly exchanged. However, often many owners do not consider the effects of transferring their vehicle to another where that vehicle includes customer information of the original owner.

Similarly, subscription services that may have been subscribed to by the present owner may inadvertently continue with a new or subsequent owner, may not receive subsequent owner customer information details and updates, and may automatically be continued at a fee even though the original owner no longer is in control of the vehicle after selling to a subsequent owner. Likewise, the subsequent owner may have difficulty signing up for subscription services if there is already an account associated with the vehicle.

Therefore there is a desire both to better inform, communicate and deactivate subscription services as well as stored customer information on vehicles that are sold, transferred or otherwise undergo a subsequent owner activity, and to enable subsequent owners to subscribe to services, via an authentication-based process, while overcoming the traditional security, financial and logistical challenges. In this manner, the ability to provide better security of data protection to original vehicle owners and enable subsequent owners to have a better experience with their ownership by using their own customer data, may be realized. The present invention is directed to such a need.

SUMMARY

In one or more embodiments, a computer implemented method is disclosed for deactivating a registered vehicle and delinking a customer associated with the registered vehicle to be deactivated via a secure vehicle registration network. The method includes providing an interactive interface for a registered account and selecting to deactivate the registered vehicle from the registered account. The method further includes transmitting a deactivation request for a registered vehicle to an authentication engine, and verifying ownership of the registered vehicle with the registered account via the authentication engine. The method preferably further includes deactivating the registration of the vehicle as owned by the registered account if verifying ownership of the registered vehicle with the registered account is successful.

A further embodiment of the present invention provides for a system for use in an automotive sales network for deactivating a registered vehicle and delinking a customer associated with the registered vehicle to be deactivated via a secure vehicle registration network. The system includes an interactive interface engine providing an interactive interface for deactivating a registered vehicle and delinking a registered customer account, which is capable of receiving and transmitting messages. The system also includes an authentication engine for receiving a deactivation and delinking request and verifying ownership of the registered vehicle with the registered customer account from one or more authorized databases. The system further includes a computer-based secure communication system capable of communications with the one or more authorized databases, the vehicle and registered customer account. Further the system includes a reporting engine for generating one or more reports in response to data from the authentication engine.

Another embodiment enables a subsequent owner, after the registered vehicle has been delinked and deactivated, to register the vehicle to the new owner, to subscribe to available services and to input the new owner's contact information to enable receipt of OEM or dealer communications relevant to the registered vehicle, such as warranty or recall information, offers for services and the like.

The present invention also provides for a computer program product containing a computer readable medium for use in an automotive sales network for deactivating a registered vehicle and delinking a customer associated with the registered vehicle to be deactivated via a secure vehicle registration network. The program instructions of the program include providing an interactive interface for a registered account; selecting to deactivate the registered vehicle from the registered account; transmitting a deactivation request for a registered vehicle to an authentication engine; verifying ownership of the registered vehicle with the registered account via the authentication engine; and, deactivating the registration of the vehicle as owned by the registered account if verifying ownership of the registered vehicle with the registered account is successful. Following deactivation, the program would permit a subsequent new owner to register the vehicle by providing VIN, contact information and the like, with the authentication engine verifying that the VIN matches a VIN eligible to receive services and that the VIN is not associated with an active account. Once authenticated, the program would enable the new owner to subscribe for services.

BRIEF DESCRIPTION OF THE DRAWINGS

FIG. 8 illustrates a process utilizing a second set of application screens on a smart phone in accordance with one or more embodiments of the invention.

DETAILED DESCRIPTION

Figure 1:
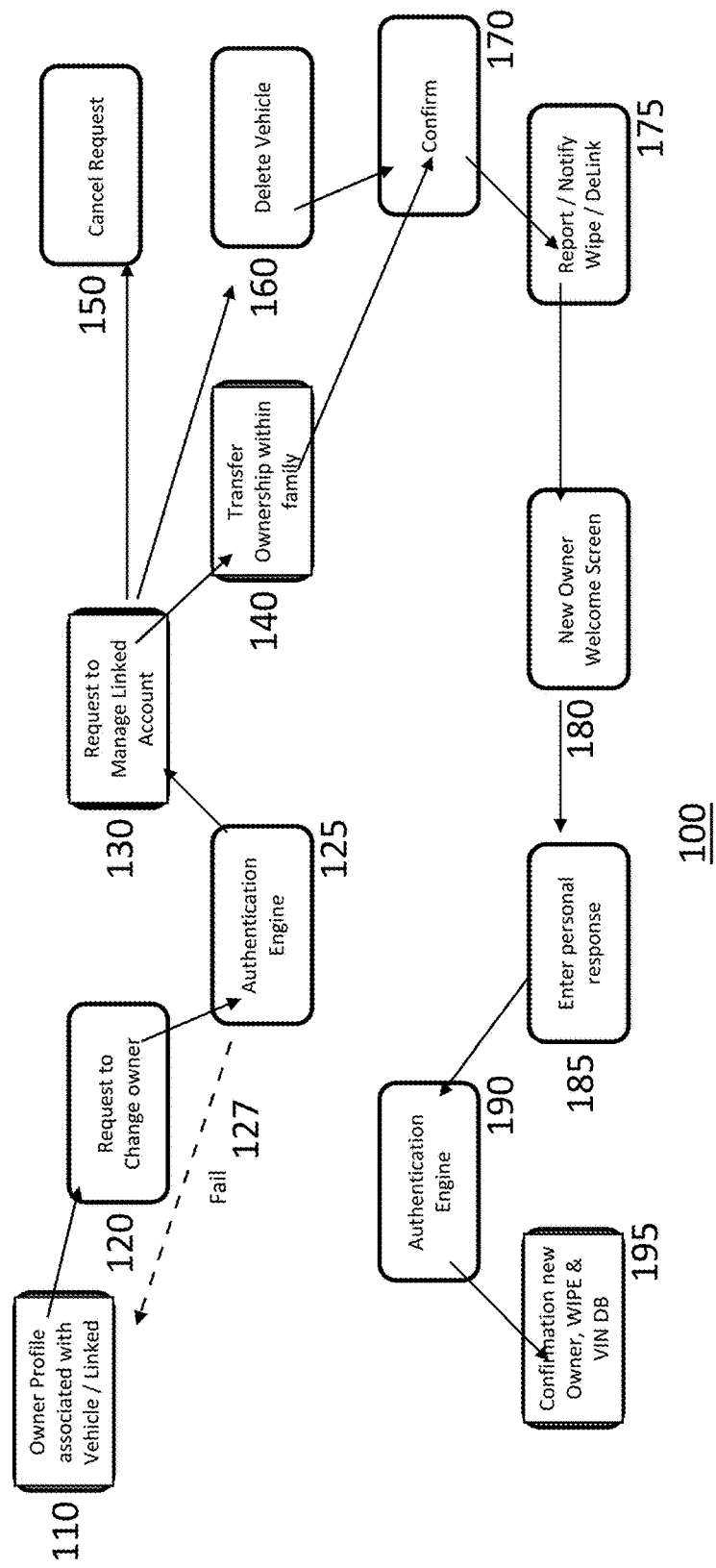
FIG. 1 illustrates a block diagram of the connected vehicle subsequent owner method in accordance with one or more embodiments of the present invention.

The present invention is directed toward an automatic connected vehicle subsequent owner method and system for automatically wiping personal data from the vehicle, transitioning remote services access to a subsequent owner, and delinking the vehicle from their smartphone or other interactive communication link.

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

It is recognized that today's vehicles have extensive memory systems which often enable a vehicle to become 'personalized' for a purchasing owner. Part of the personalization includes placing into memory details of the owner's information (also known as customer information). Details that are often stored in vehicles may include the customer's name, phone numbers, address, security codes, garage access, cell phone and wifi accounts, communications passwords and usernames, etc., as well as a history of date, time and location of when various services were accessed. When an owner sells the vehicle or otherwise transfers the vehicle to another, often these personalized details (i.e., personal data) are forgotten, ignored, or too difficult to remove from the vehicle's memory. In addition, there is often no simple way for a subsequent owner to notify the auto OEM of the new owner's contact information in the case of recalls, service alerts or other issues relevant to the new owner, or for the new owner to elect to receive subscription-based services. The present invention overcomes these undesired outcomes.

The embodiments presented here utilize machine learning and automation so that the process and system can be used for large scale application. The vehicle owner identification may begin with first owner of the vehicle who purchased the vehicle from the dealer, where the vehicle is registered or enrolled as belonging to that owner and is linked to a specific account during enrollment process. (The enrollment process is described in detail in the related to U.S. patent application Ser. No. 14/927,221, filed on Oct. 29, 2015, and entitled "AUTOMATIC CONNECTED VEHICLE ENROLLMENT").

Once registered, the behavior of the registered vehicles may be monitored based on usage parameters provided to the system including location, wireless network access, services. If a vehicle begins reporting that it is regularly outside the enrollment/account "norms" or the defined usage parameters for that account listed above, for example, location, wireless network access, services, and/or extreme data usage, the system checks for an account set up with change in account information. If none exists, the system automatically messages the vehicle to enroll as a sold/leased vehicle where the vehicle is transferred from one owner to another. The system may also perform a periodic re-credentialing at predefined time intervals even if there is no change in the usage patterns. The process of monitoring the vehicle is an automated process based on machine learning and depends on what the system "learns" from the vehicle's usage with respect to the defined usage parameters during account creation or may be based on patterns developed within the first few months of vehicle ownership.

Currently, original equipment manufacturers (OEM), e.g. automakers, may have a difficult time knowing who is actually selling their vehicles because of the prevalence of vehicle swapping and because of privacy laws and lack of ability to force dealers who sell the vehicles into sharing information. The automakers have to rely on snail mail. Instead, the system described herein may "ask" the vehicle to inform the automaker of any ownership change, periodically re-credential the vehicle owner to check if the automaker's or OEM's account is accurate, and/or communicate directly with the vehicle occupants to check and confirm the ownership/change in ownership of the vehicle. All of this is done via machine learning, pattern recognition, and automation requiring minimal or no human interaction.

FIG. 1 illustrates a block diagram 100 of the connected vehicle subsequent owner method in accordance with one or more embodiments of the present invention.

From FIG. 1, at 110 the owner profile is known and is associated with a particular vehicle identification number (VIN) of a vehicle. The known data is available through a secure link to a customer information database and a vehicle information database, each of which may contain public and private records. The owner of the identified vehicle is also a registered user of a linked and secure communication system which provides for communication between a remote server and the vehicle. As used herein the customer is the present owner of the vehicle.

Preferably, the linked and secure communication system includes a remote server, one or more authorized databases having customer information, dealer information, vehicle information and marketing information. The vehicle's communication system is able to transmit and receive message with the remote server and the customer across the authorized vehicle network. The customer is also able to communicate with the remote server and with the vehicle across the authorized vehicle network, where the customer preferably is using an interactive interface device. In an embodiment, the interactive interface includes one or more of an in-vehicle computer touch screen, an application for a smart phone having an input capability, a shared messaging service, a web page, a web-based hyperlink, and an email requiring a response.

From FIG. 1, the owner (i.e., customer) has elected to change ownership of the registered vehicle at 120. In doing so, in accordance with one or more embodiments of the present invention, the customer is first authenticated as being the owner of the vehicle identified by an authentication engine at 125. Preferably, the customer logs into the secure communication network by using the registered username and password. Once authenticated, the customer is able to undertake specific actions related to the ownership of their vehicle(s). If the owner is not authenticated, a fail message is returned to the user via 127.

At 125, after being authenticated, the customer is able to manage their linked account remotely through the interactive interface. The customer may choose to request to manage the liked account at 130 and then more specifically identify that as part of the account management it is desired to remove a registered vehicle from the account due to an ownership change. The customer may be transferring the vehicle from themselves to another family member, such as at 140; may elect to cancel the transaction such as at 150; or may be deleting the vehicle from their account due to a sale, donation, or accident at 160.

Where the customer elects to transfer the vehicle at 140 or delete the vehicle 160, a reaffirming confirmation is requested from the communication system to ensure the decision of the customer is correct, such as at 170. Where the customer reaffirms the action, then the communication system updates the associated databases as to removing ownership associated with the vehicle from the customer, assigns new ownership of the vehicle to a subsequent customer (e.g., purchaser), and updates VIN databases to reflect ownership and customer information associated with ownership, scubas at 175. In an embodiment of the present invention, a command is sent to the vehicle to wipe the head unit (i.e., memory) of the customer information, a notification is sent to the customer of the actions undertaken, and a notification is sent to vehicle information database of the subsequent ownership of the vehicle.

In a further embodiment, once subsequent ownership is confirmed, a command is sent to the vehicle to display a 'welcome' message within the vehicle, preferably on a dash screen or other interactive interface, in which a response is requested from the subsequent customer (i.e., new owner), at 180. The new owner may then participate and respond with a response to the requested information, which may be a request for instance of at least one aspect of customer information such as an email, at 185. The response is then received by the authentication engine where the authentication will compare the received customer information with that in a secure customer information database and authenticate the response, at 190. In an embodiment, the authentication engine will also reaffirm that the vehicle head unit was 'wiped' of the prior owner's personal data and then send a responding message to the subsequent owner with access codes, feature options and solicit interest in associated subscription services, etc., at 195.

In one or more embodiments of the present invention, customer information may be used in conjunction with the demonstrator registry to effect an improved personalized approach in creating an enhanced environment for selling to a customer. For example, a customer's name, email and phone number may be associated with the subscription services of the demonstrator for a particular test drive in which the customer already appreciates how the vehicle appears tailored for the individual customer's use, thereby possible enhancing the purchasing experience and likelihood of the customer purchasing a vehicle based on the test drive. Similarly, a dealer's information may be used in conjunction with the demonstrator registry to effect a demonstrator which reminds a user of the demonstrator of additional services at the dealership, the reputation of the dealership and the satisfaction other customers have had at the dealership, for example.

Additionally, vehicle information may also be similarly utilized in the present invention to associate the customer, the dealer and demonstrator in an improved sales environment where there is an increased opportunity for creating a sale of a vehicle using the present invention.

For instance without limitation, dealer information may include name, address, email, cell phone number, social security information, security code, self-identifying key numbers, user name, user password, mobile device information, and other information pertinent to the dealer in relation to the sales transaction. Dealer information may also include, without limitation, one or more of dealer identification information, dealer purchasing history, dealer ownership information, dealer geolocation information, dealer subscription information, dealer account data, dealer contact information, dealer marketing information, publicly available information about the dealer and private sourced information about the dealer, etc.

For instance without limitation, customer information may include name, address, email, cell phone number, social security information, security code, self-identifying key numbers, user name, user password, mobile device information, and other information pertinent to the customer in relation to the sales transaction. Customer information may also include, without limitation, one or more of customer identification information, customer purchasing history, customer ownership information, customer geolocation information, customer subscription information, customer account data, customer contact information, customer marketing information, publicly available information about the customer and private sourced information about the customer, etc.

By example, for instance without limitation, vehicle information may include vehicle identification number (VIN), brand and model, OEM proprietary data related to the vehicle, title information, dealership codes, delivery codes, security information, key codes, and other information pertinent to the vehicle in relation to the sales transaction, etc.

Additionally, customer and/or vehicle information may include information inclusive of that which is available in retail delivery reports and databases (RDRs), registered vehicles data, registered vehicle owners data, registered vehicle credentials data, registered vehicle identification data, registered vehicle security data, vehicle identification number (VIN) data and history, geolocation and history, depositional information and history, title information and history, insurance information and history, ownership information and history, past history information, subscription information, vehicle geolocation information, publicly available information, and private sourced information, etc. Further customer and/or vehicle information may include marketing information including web history associated with vehicle manufacturer, prior contacts with vehicle manufacturer and distributor, incentive and rebate utilization, third party information (e.g., Nielsen, IHS and Polk databases) responses to targeted marketing regarding vehicle, email address(es), and registered applications utilized by customer, etc.

Figure 2A:
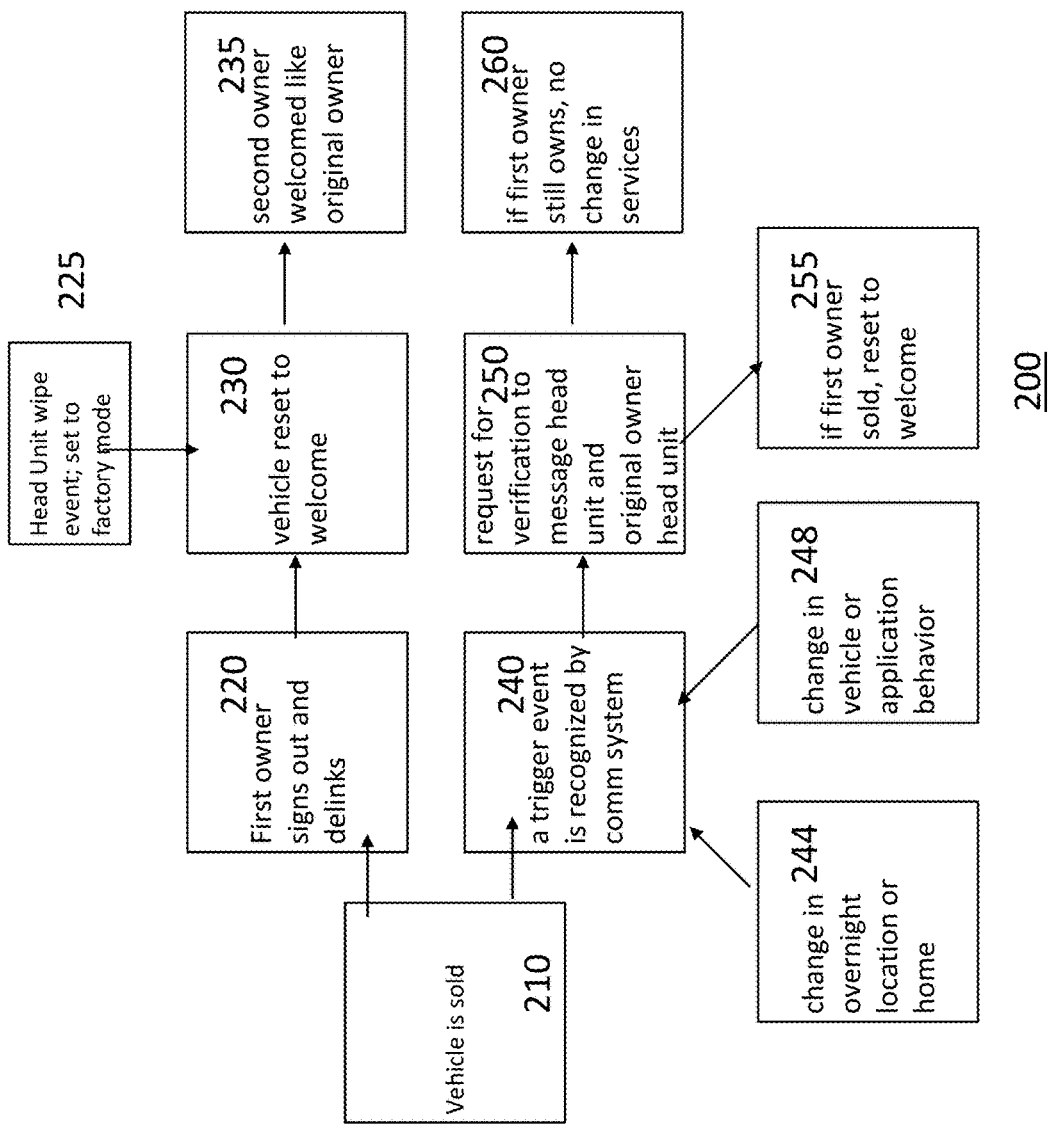
FIG. 2A illustrates a block diagram of the connected vehicle subsequent owner method in accordance with one or more embodiments of the present invention.

FIG. 2A illustrates a block diagram 200 of the connected vehicle subsequent owner method in accordance with one or more embodiments of the present invention.

From FIG. 2A, a preferred path creating an automated series of events is desired. The preferred path is along 210, 220, 225, 230 and 235. The less desired path, for one which the present invention is well-suited for, is along path 210, 240, 250 and 260, which requires a triggering process based on customer information and activity deviations.

At 210, the vehicle is sold by a first customer to a subsequent owner. At 220, the first owner activates the link application and manages the account via an interactive interface. In managing the account the first customer provides information about the sale, the subsequent customer, and status of the event. Additionally once, the account reflects that the vehicle has been sold to another, the first customer also delinks from the account with reference to the identified vehicle. With the delinking and sales transaction affirmed, a command is sent to the car to win the head unit and return the settings to factory status at 225. Accordingly, in response, a welcome screen is set to display within the vehicle absent any customer information of the prior owner at 230. The subsequent owner will then be able to access the vehicle and see a welcome screen without any prior customer information at 235. Accordingly, all customer information and vehicle information databases associated with the secure automotive network are updated to reflect the transaction and activity associated with the vehicle.

At 210, the vehicle is sold by a first customer to a subsequent owner. At 240, a triggering event is determined based upon status information associated with the vehicle and/or customer. Status information may reflect changes to 'normal' activity in customer information or vehicle information. For instance, a change in the overnight location of the vehicle or a change in the address of the home designation within the GPS mapping system, is a triggering event (such as at 244 and 248). It will be appreciated by those skilled in the art that there are various arrangements foreseeable using the present invention.

Once the triggering event is recognized by the present invention, at 250, a request for verification is made to the vehicle and to the listed owner in the secure database. For instance, a command is sent to the vehicle to request additional information and activities over a specific period of time; a request may be emailed or communicated to the customer via the networked system to inquire if the vehicle has been sold, is missing, or has been temporarily loaned to another, for instance. In the event the owner responds that the vehicle has been sold, such as at 255, the vehicle head unit is rest to factory and the data is wiped. If the registered owner is determined to remain the owner of the vehicle then there are no changes in service and no further action is taken, at 260.

In accordance with one or more embodiments of the present invention, vehicle, dealer, marketing and/or customer data may be provided to the vehicle's communication system. The vehicle communication system may include cellular and/or wifi enabling communication protocols to enable receipt and transmission of messages to and from an authorized server, local link, and/or remote communication system, such as the authentication engine.

Figure 2B:
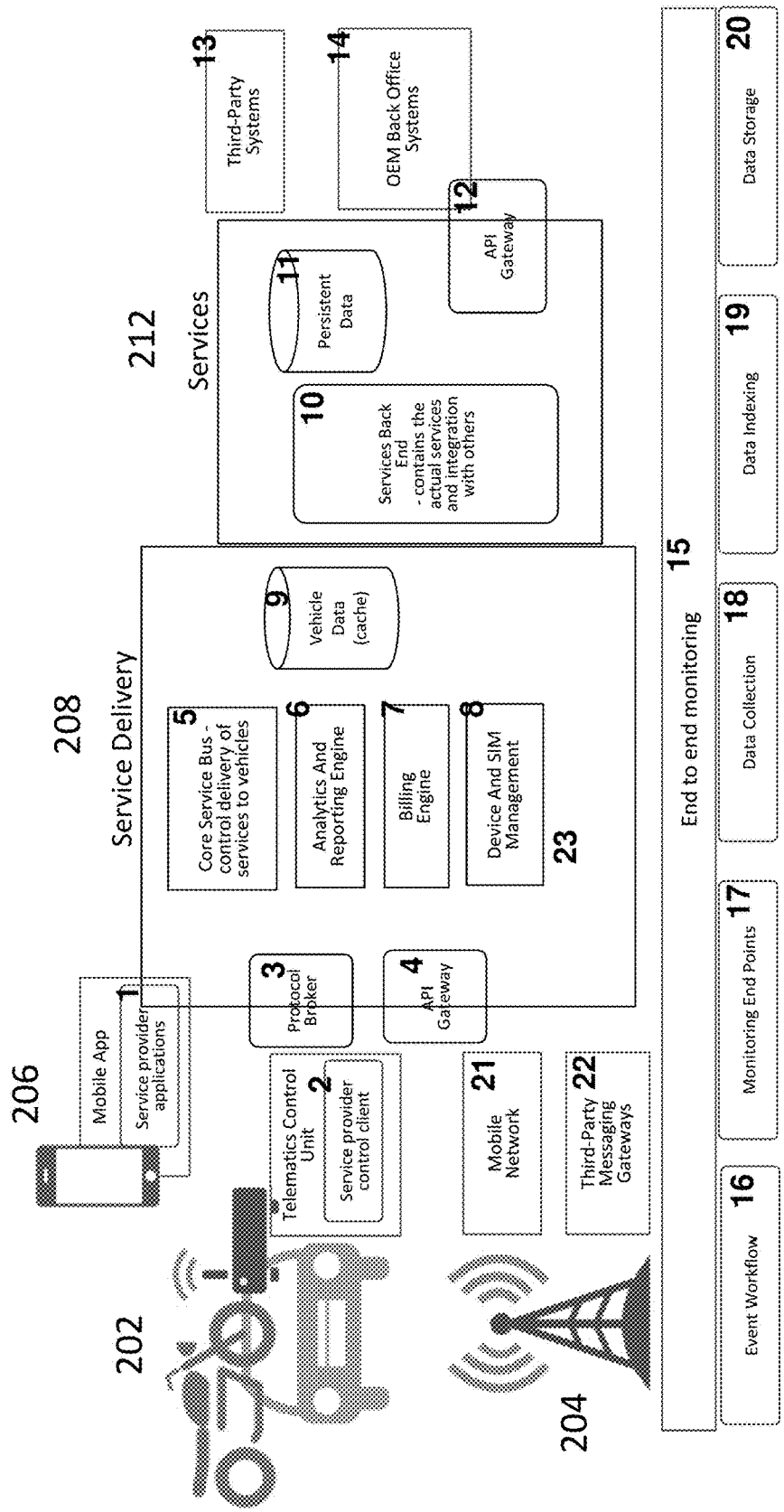
FIG. 2B illustrates a block diagram 200' of a system used in the connected vehicle subsequent owner method in accordance with one or more embodiments of the present invention.

FIG. 2B illustrates a block diagram 200' of a system used in the connected vehicle subsequent owner enrollment method in accordance with one or more embodiments of the present invention. The interactive interface described in the description accompanying FIG. 2A may be a portal provided by original equipment manufacturer (OEM) and may be used to manage vehicle owner accounts. The interactive interface may include any one or more of a mobile application 1 or a telematics control unit 2, also known as a service provider control client, in communication with a service delivery system 208.

The authentication engine described in the description accompanying FIGS. 1 and 2A may include many components used in conjunction to determine which person(s) have access to what vehicle(s) and which (exact) services. As described in the description accompanying FIGS. 1 and 2A, a remote server may act as an authentication engine that verifies registration qualification of the registered vehicle by the user, which may a registered user. Once the registration qualification is successfully verified, the customer is able to undertake specific actions related to the ownership of their vehicle(s). If the owner is not authenticated, a fail message is returned to the user. The components of authentication engine along with the remote server described above may include any of a mobile application 1 or a telematics control unit 2, also known as a control client, in communication with a service delivery system 208 including a protocol broker 3 and API gateway 4 communicatively coupled to core service bus 5 which in turn is connected to analytics and reporting engine 6, billing engine 7 and vehicle data (cache) 9. The authentication engine may periodically re-credential the vehicle owner to check if the account information stored in the system is accurate.

Once the verification of a successful comparison is achieved via authentication engine, the customer is able to undertake specific actions related to the ownership of their vehicle(s). If the owner is not authenticated, a fail message is returned to the user may be passed to the vehicle to be registered by a registration event. After being authenticated, the customer is able to manage their linked account remotely through the interactive interface. The customer may choose to request to manage the linked account and then more specifically identify that as part of the account management if it is desired to remove a registered vehicle from the account due to an ownership change. The customer may be transferring the vehicle from themselves to another family member; may elect to cancel the transaction; or may be deleting the vehicle from their account due to a sale, donation, or accident as described in the description accompanying FIG. 1.

Where the customer elects to transfer the vehicle or delete the vehicle, a reaffirming confirmation is requested from the communication system to ensure the decision of the customer is correct. Where the customer reaffirms the action, then the communication system updates the associated databases, for example, vehicle data 9, as to removing ownership associated with the vehicle from the customer, assigns new ownership of the vehicle to a subsequent customer (e.g., purchaser), and updates VIN databases to reflect ownership and customer information associated with ownership. In an embodiment of the present invention, a command is sent to the vehicle to wipe the head unit (i.e., memory) of the customer information, a notification is sent to the customer of the actions undertaken, and a notification is sent to vehicle information database of the subsequent ownership of the vehicle.

The core service bus 5 controls the delivery of services to vehicles based on authentication and authorization of vehicles by interacting with services 212 which may include services backend 10, persistent data 11, API gateway 12 in communication with OEM back office systems 14 and/or third party systems 13 providing services and a mobile network 21 used for communication. In accordance with one or more embodiments of the present invention, vehicle, dealer, marketing and/or customer data may be provided to the vehicle's communication system. The vehicle communication system may include cellular and/or Wi-Fi (satellite and/or other wireless communications and/or combination of several wireless technologies) enabling communication protocols to enable receipt and transmission of messages to and from an authorized server, local link, and/or remote communication system, such as the authentication engine. In one or more embodiments, once authentication is granted, the subsequent owner may activate subscription services and access to the vehicle for use including generating a 'welcome' message for the visual display within the vehicle. The welcome message can be personalized via automated processes.

The computer based secure communication may include a combination of software and vehicle hardware, mobile application, mobile network access and management as well as monitoring, and reporting functions. The computer based secure communication system may provide communication between a telematics control unit 2, also known as a control client, in communication with a service delivery system 208 including a protocol broker 3 and API gateway 4 which are communicatively coupled to device and SIM management 8 and vehicle data 9 cache. The service delivery system 208 in connected to services including persistent data 11, API gateway 12 in communication with OEM back office systems 14 and/or third party systems 13, a mobile network 21 used for communication, third party messaging gateway 22 and connectivity management 23.

In one or more embodiments, reporting from the system of the present invention may include reports of data identifying vehicles sold, subscription services selected and enabled, success and failure rates of activation and registration, timing and time score associated with sales deliveries, location, wireless network access, services usage, etc. The reporting engine may include components that track usage across applications in the vehicle, on the wireless network, on the services delivery platform, and other $3^{rd}$ party systems, and may include components such as end to end monitoring 15, event workflow 16, monitoring endpoints 17, data collection 18, data indexing 19 and data storage 20 in addition to the components described above.

For example, any one or more of the end to end monitoring 15, event workflow 16, monitoring endpoints 17, data collection 18, data indexing 19 and data storage 20 may be used to periodically monitor the vehicle, develop a pattern of "normal" behavior that may include location, wireless network access, services usage, etc. Using such monitoring a usage pattern may be developed within the first few months of vehicle ownership. When an abnormality in the learned pattern is noticed, the situation may be analyzed to find the reasons for such abnormality. If the abnormality detected is categorized as one of very high importance like extreme data usage, the system may block access to services and networks for that vehicle.

Figure 3:
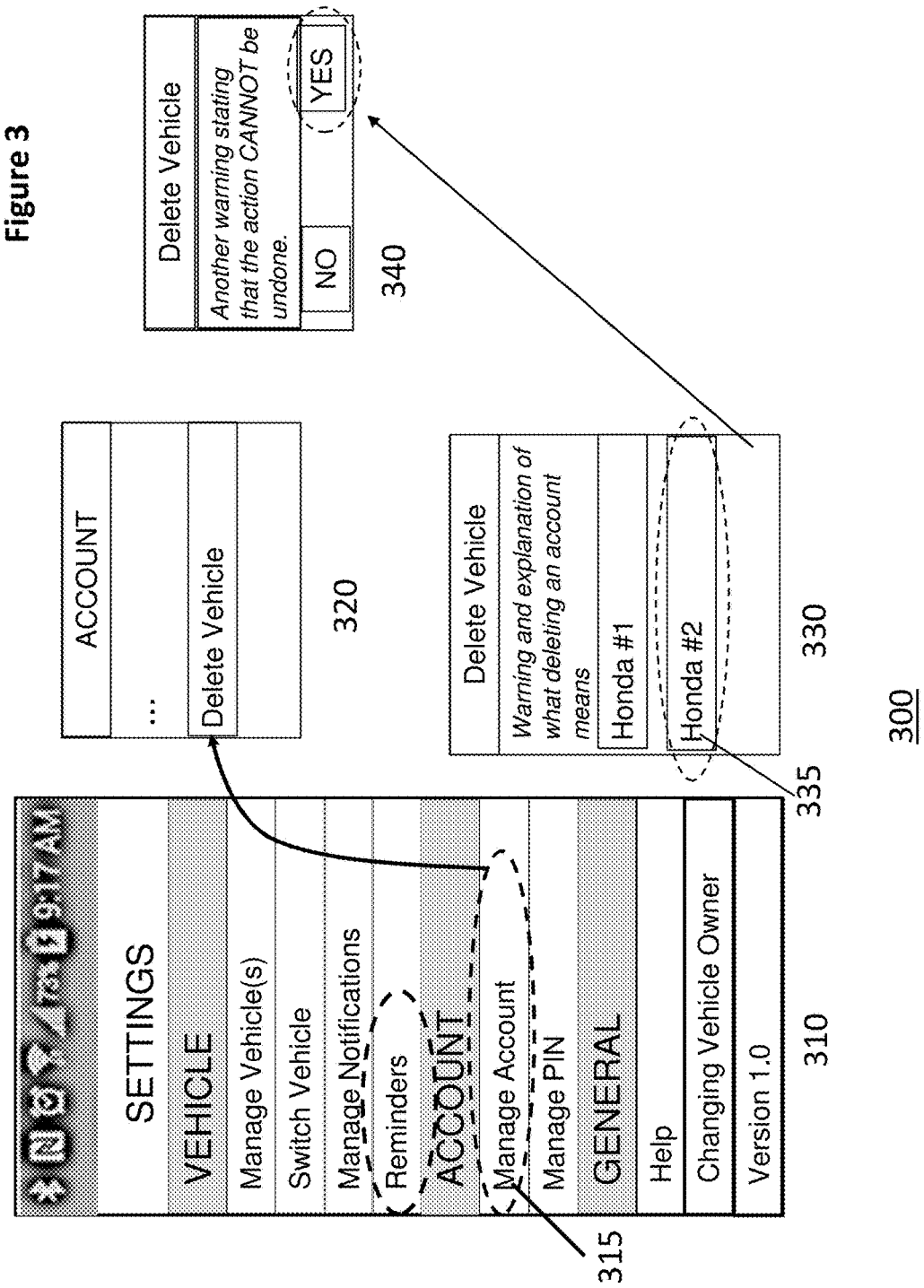
FIG. 3 illustrates a process utilizing a first set of application screens on a smart phone in accordance with one or more embodiments of the invention.

FIG. 3 illustrates a process 300 utilizing a first set of application screens on a smart phone in accordance with one or more—embodiments of the invention.

From FIG. 3, at 310 a smart phone depiction is used to indicate the presence of an active application in which link services of the present invention may be utilized. At 310, a user has already logged in to the secure network system and has accessed their account. At 315, the registered user is electing manage their account. Once manage account is selected, for example, a choice available to the user is to remove a vehicle. The depiction of the choice is at 320, where the 'delete vehicle' option is visible.

At 320, once the user has indicated to 'delete' vehicle, a confirmation screen appears showing which vehicle(s) are selected for delete at 330 and a final confirmation screen seeking a user's reaffirmation that the deletion should proceed is set forth at 340.

Figure 4:
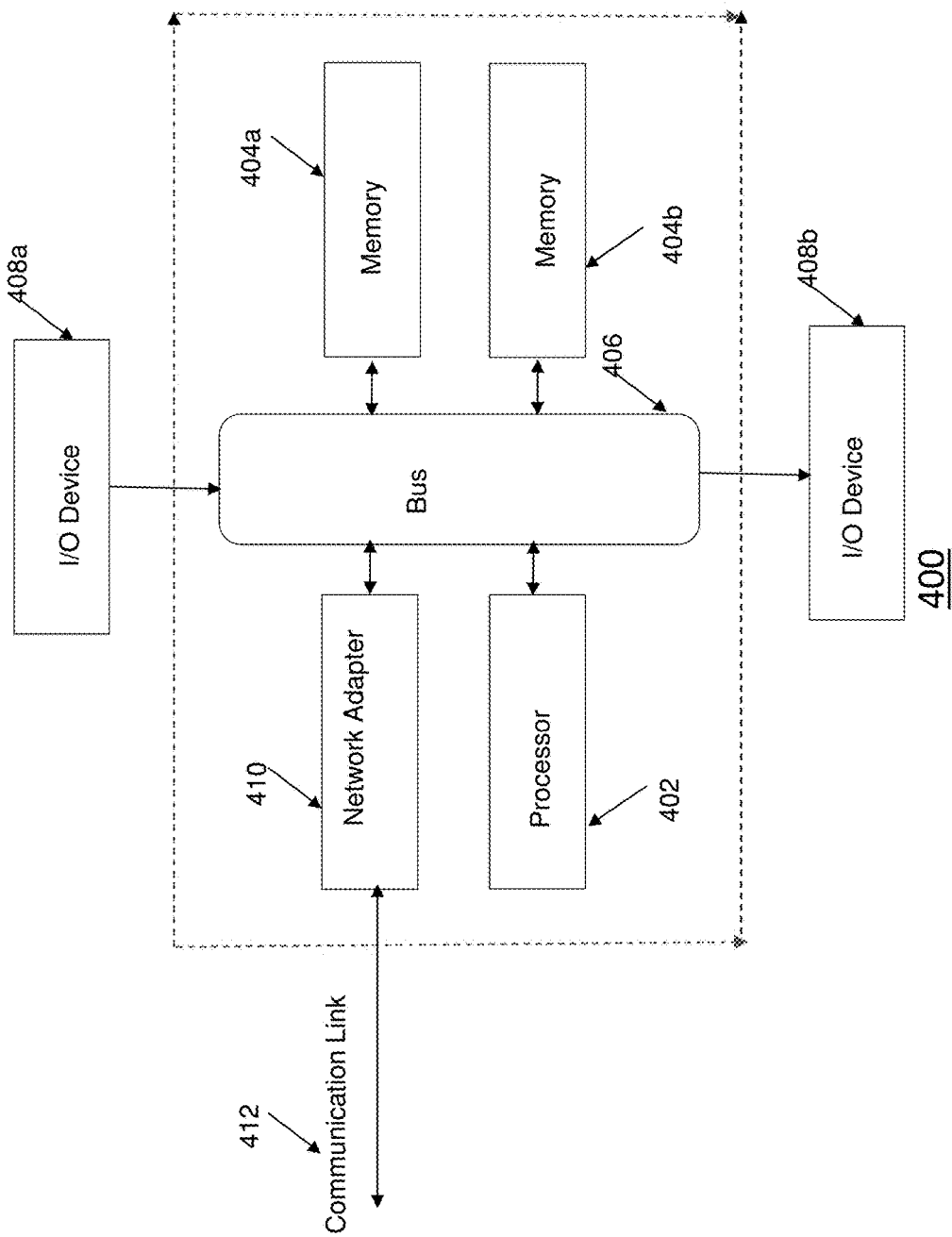
FIG. 4 illustrates a data processing system suitable for storing the computer program product and/or executing program code in accordance with an embodiment of the present invention.

FIG. 4 illustrates a data processing system 400 suitable for storing the computer program product and/or executing program code in accordance with an embodiment of the present invention. The data processing system 400 includes a processor 402 coupled to memory elements 404a-b through a system bus 406. In other embodiments, the data processing system 400 may include more than one processor and each processor may be coupled directly or indirectly to one or more memory elements through a system bus.

Memory elements 404a-b can include local memory employed during actual execution of the program code, bulk storage, and cache memories that provide temporary storage of at least some program code in order to reduce the number of times the code must be retrieved from bulk storage during execution. As shown, input/output or I/O devices 408a-b (including, but not limited to, keyboards, displays, pointing devices, etc.) are coupled to the data processing system 400. I/O devices 408a-b may be coupled to the data processing system 400 directly or indirectly through intervening I/O controllers (not shown).

In FIG. 4, a network adapter 410 is coupled to the data processing system 402 to enable data processing system 402 to become coupled to other data processing systems or remote printers or storage devices through communication link 412. Communication link 412 can be a private or public network. Modems, cable modems, and Ethernet cards are just a few of the currently available types of network adapters.

Figure 5:
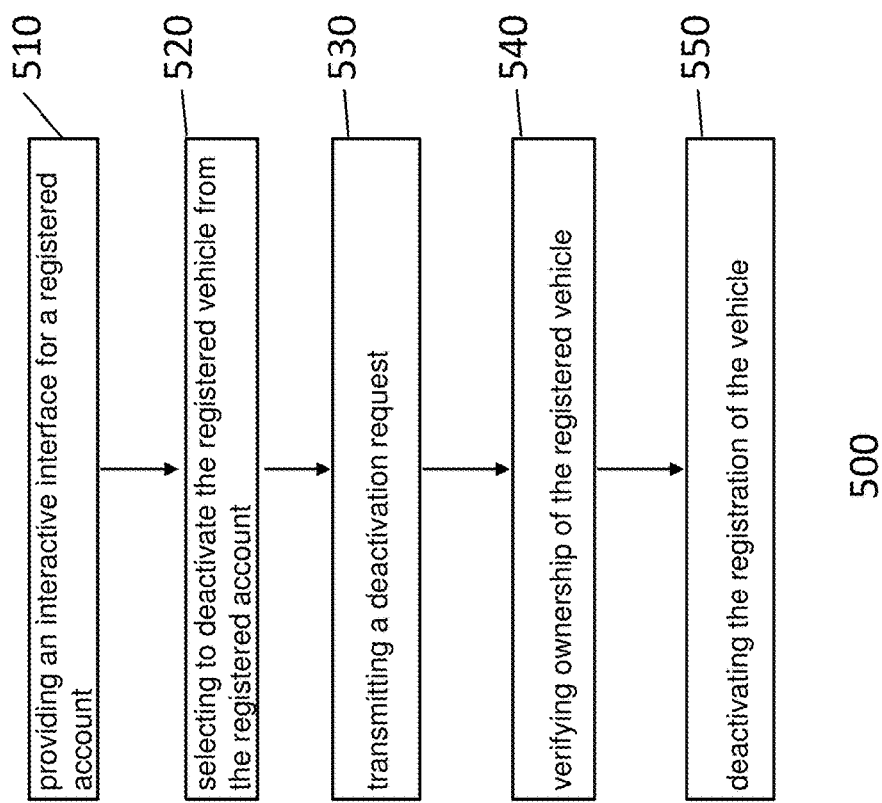
FIG. 5 sets forth a process of an embodiment of the present invention in which a vehicle is deactivated from services due to the sale of the vehicle to a subsequent owner.

FIG. 5 sets forth a process 500 of an embodiment of the present invention in which a vehicle is deactivated from services due to the sale of the vehicle to a subsequent owner.

From FIG. 5, at 510, the present invention provides for an interactive interface for a registered account. In an—embodiment, the interactive interface includes one or more of an in-vehicle computer touch screen, an application for a smart phone having an input capability, a shared messaging service, a web page, a web-based hyperlink, and an email requiring a response.

At 520, the present invention provides for selecting to deactivate the registered vehicle from the registered account. In an—embodiment the selection is via a click-based or menu-based system available via a smart phone application.

At 530, the present invention provides for transmitting a deactivation request for a registered vehicle to an authentication engine. Preferably, the registered user is able to identify which vehicle already on the account is to be removed due to the sale of the vehicle.

At 540, the present invention provides for verifying ownership of the registered vehicle with the registered account via the authentication engine. In an—embodiment, verifying ownership of the vehicle with the registered account includes comparing at least one or more predetermined characteristics of the customer information and one or more predetermined characteristics of the vehicle information with associated data in one or more authorized databases having known customer information and known vehicle information. Further, preferably, the authentication engine is a remote server configured for secure communication with the vehicle to be registered and the registered user.

At 550, the present invention provides for deactivating the registration of the vehicle as owned by the registered account if verifying ownership of the registered vehicle with the registered account is successful. In a further embodiment, the present invention provides for one or more of: sending a wipe clean command to a vehicle to be deactivated thereby removing customer information from the vehicle which may be associated with present ownership; sending a command to the vehicle after deactivation to display a welcome message with factory defaults for the subsequent owner of the vehicle; and, delinking the customer from accesses the interactive interface associated with the deactivated vehicle.

Figure 6:
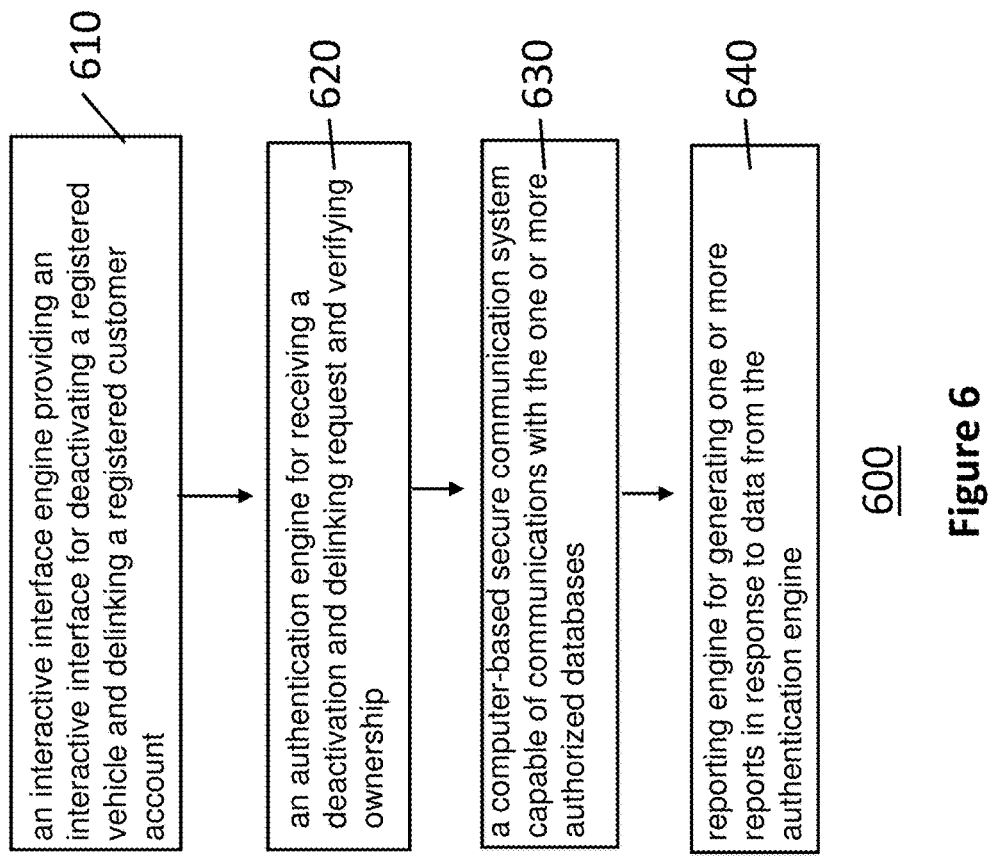
FIG. 6 sets forth a process of an embodiment of the present invention in which a vehicle is deactivated and a customer account is delinked from services due to the sale of the vehicle to a subsequent owner.

FIG. 6 sets forth a process 600 of an embodiment of the present invention in which a vehicle is deactivated and a customer account is delinked from services due to the sale of the vehicle to a subsequent owner.

From FIG. 6, at 610 the present invention includes an interactive interface engine providing an interactive interface for deactivating a registered vehicle and delinking a registered customer account, which is capable of receiving and transmitting messages. In an embodiment, the interactive interface includes one or more of an in-vehicle computer touch screen, an application for a smart phone having an input capability, a shared messaging service, a web page, a web-based hyperlink, and an email requiring a response. The interactive interface engine is described in detail in the description accompanying FIGS. 1, 2A and 2B.

From FIG. 6, at 620 the present invention includes an authentication engine for receiving a deactivation and delinking request and verifying ownership of the registered vehicle with the registered customer account from one or more authorized databases. The authentication engine is described in detail in the description accompanying FIGS. 1, 2A and 2B.

From FIG. 6, at 630 the present invention includes a computer-based secure communication system capable of communications with the one or more authorized databases, the vehicle and registered customer account. The computer based secure communication is described in detail in the description accompanying FIGS. 2A and 2B.

From FIG. 6, at 640 the present invention includes and a reporting engine for generating one or more reports in response to data from the authentication engine. In an embodiment, the present invention further includes a deactivation engine for deactivating the registered vehicle and for delinking the registered customer account and is capable of wiping customer data from the vehicle once deactivated.

Preferably, in one or more embodiments, reporting from the system of the present invention will include reports of account management and activity related to sold or transferred vehicles.

Figure 7:
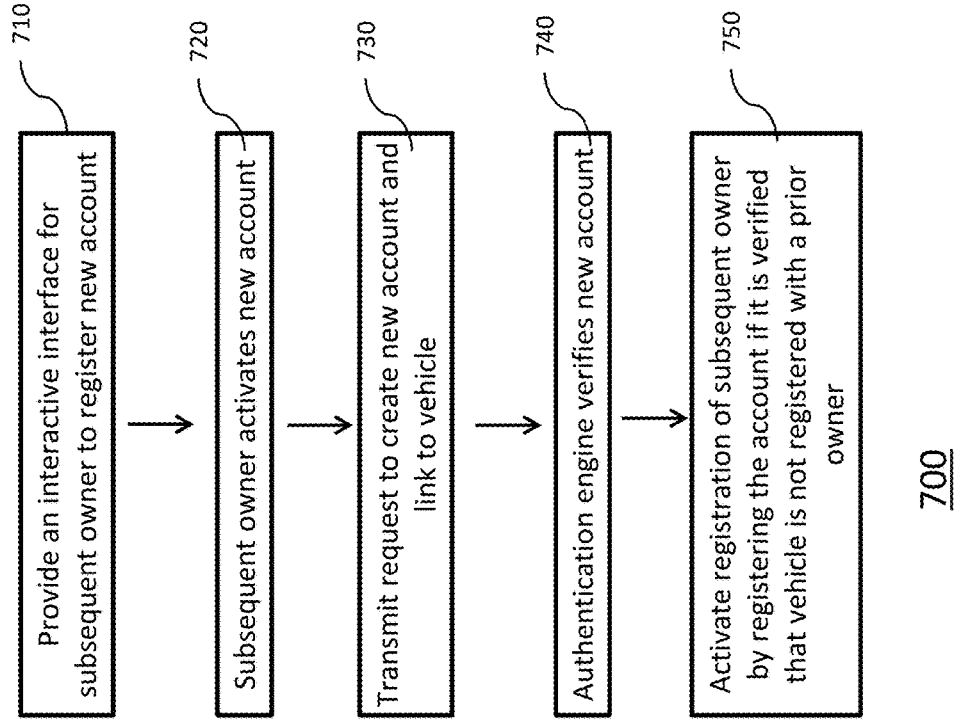
FIG. 7 sets forth a process of an embodiment of the present invention in which a subsequent owner registers a new account after system verification of deactivation of prior account and eligibility of the vehicle to receive services and subscribes to desired services.

FIG. 7 illustrates a process 700 of an embodiment of the present invention in which a subsequent owner registers an account and a vehicle after verification that no active account exists and that the vehicle is eligible to receive services.

In an embodiment, at 710, an interactive interface is provided for a subsequent owner to register a new account for a transferred vehicle. In an embodiment, the interactive interface includes one or more of an in-vehicle computer touch screen, an application for a smart phone having an input capability, a shared messaging service, a web page, a web-based hyperlink, and an email requiring a response. The interactive interface engine, also known as interactive interface is described in detail in the description accompanying FIGS. 1, 2A and 2B.

At 720, the subsequent owner activates a new account and registers the vehicle by providing VIN, username, password, email address, credit card number for payment of subscription services and other relevant information. In an embodiment the selection is via a click-based or menu-based system available via the in-vehicle touch screen or a smart phone application.

At 730, a request is transmitted to create a new account and link the VIN of the vehicle to the new account. At 740, an authentication engine verifies that there is no active account associated with that VIN and that the vehicle is eligible to receive services by comparing the VIN with associated data in one or more authorized databases having known customer information and known vehicle information. Further, preferably, the authentication engine is a remote server configured for secure communication with the vehicle to be registered and the user seeking registration. The authentication engine is described in detail in the description accompanying FIGS. 1, 2A and 2B. The computer based secure communication is described in detail in the description accompanying FIGS. 1, 2A and 2B.

In an alternative embodiment where the prior owner knows the identity of the subsequent owner, the authentication engine sends a confirmation request to the last registered user asking for verification of the eligibility of the subsequent owner to register the vehicle and, if verification is received, returns a verification code to the new owner by email to be input.

At 750, the registration of the vehicle as owned is activated by the subsequent owner registering the account if verifying deactivation of the registered vehicle and delinking with any prior registered account is successful, and returning a welcome message to the new registered owner with display of an interactive screen for set up of and subscription to available services.

FIG. 8 illustrates a process 800 utilizing a second set of application screens on a smart phone in accordance with one or more embodiments of the invention.

From FIG. 8, at 810, a smart phone depiction is used to indicate the presence of an active application in which the new owner may subscribe to available services in accordance with the present invention. The user 820 is now logged in to the secure network system and has access to the newly-established account. At 815, the new registered user is electing manage their account. Once manage account is selected, for example, a choice available to the user is to add services to the vehicle. The depiction of the choice is at 820 where the 'subscribe to services' option is visible.

At 820, once the user has indicated to add a subscription for services to the account, a confirmation screen appears showing which service(s) are selected to be added at 830 and a final confirmation screen seeking a user's reaffirmation that the services should be added and that the user's payment card should be billed is set forth at 840. As used herein the term subscription-based services may include any vehicle service or customer service such as those associated with telematics, safety and security, remote services, navigation, performance, geolocation and geopositional, diagnostics, convenience applications, general information, utilization of publicly accessible data and electronic databases, etc. The term subscription-based is not intended to imply a for-fee service is required, rather the term is specific to indicate that customer must subscribe to the particular service through an activation or registration event associated with the vehicle; once the customer subscribes to the service, the service is then available to the customer through the vehicle.

Other exemplary services which are intended to be part of the present invention as being subscription services available include but are not limited to: (1) Safety and Security services including ACNDirect, SOS, Vehicle Finder; (2) Remote Services including door lock/unlock, engine start, horn honk, flash lights, trunk open, cabin pre-conditioning, geofencing and speed alerts, window control; (3) Performance Services including: performance report, vehicle snapshot, remote vehicle information; OTA updates and upgrades; (4) Navigation Services including: maps, map updates, real-time traffic, speed cam warnings, POI search, parking spots; (5) Infotainment Services including: cloud-based applications, streaming music, streaming video, internet browsing, news, stocks, sport scores, concierge, movie listings, flight info, calendar, weather forecast.

While the present invention has set forth sequences and/or steps involved in one or more embodiments of the present invention, the present invention is not so limited as to require the sequences set forth to be required to perform the present invention; the present invention may be adapted and enabled using the sequences and/or steps in varied configurations and order, whereas the present invention will remain operational as intended and perform successfully.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims. Many other embodiments of the present invention are also envisioned.

Any theory, mechanism of operation, proof, or finding stated herein is meant to further enhance understanding of the present invention and is not intended to make the present invention in any way dependent upon such theory, mechanism of operation, proof, or finding. It should be understood that while the use of the word preferable, preferably or preferred in the description above indicates that the feature so described may be more desirable, it nonetheless may not be necessary and embodiments lacking the same may be contemplated as within the scope of the invention, that scope being defined by the claims that follow.

Similarly, it is envisioned by the present invention that the term communications and network includes communications across a network using one or more communication architectures, methods, and networks, including but not limited to: Code division multiple access (CDMA), Global System for Mobile Communications (GSM) ("GSM" is a trademark of the GSM Association), Universal Mobile Telecommunications System (UMTS), Long Term Evolution (LTE), 4G LTE, wireless local area network (WIFI), and one or more wired networks.

Accordingly, a system and method in accordance with one or more embodiments presented above overcomes the challenges of existing practices and provides a more robust and convenient approach to better enroll customers with their vehicle via an authentication-based process while overcoming the traditional security, financial and logistical challenges.

Embodiments described herein can take the form of an entirely hardware implementation, an entirely software implementation, or an implementation containing both hardware and software elements. Embodiments may be implemented in software, which includes, but is not limited to, application software, firmware, resident software, microcode, etc.

The steps described herein may be implemented using any suitable controller or processor, and software application, which may be stored on any suitable storage location or computer-readable medium. The software application provides instructions that enable the processor to cause the receiver to perform the functions described herein.

Furthermore, embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include DVD, compact disk-read-only memory (CD-ROM), and compact disk read/write (CD-R/W).

What is claimed is:

1. A computer implemented method for deactivating a registered vehicle and delinking a customer associated with the registered vehicle to be deactivated via a secure vehicle registration network, the method comprising:
   selecting, by an interactive interface, deactivation of a registered vehicle from a registered account;
   transmitting, by the interactive interface, a deactivation request for a registered vehicle to an authentication engine;
   in response to verification of ownership of the registered vehicle with the registered account by the authentication engine:

deactivating, by the interactive interface, the registered vehicle from the registered account, and commanding, by the interactive interface, a wipe of customer data at the registered vehicle; and transferring a predetermined level of subscription services with the vehicle to a subsequent owner after deactivation of the registration of the vehicle from an original owner, wherein the predetermined level of subscription services include at least one of: remote services of the vehicle or performance services of the vehicle, wherein the remote services include at least one of: door lock/unlock, engine start, horn honk, flash lights, trunk open, cabin pre-conditioning, geofencing and speed alerts, or window control, and wherein the performances services include Over-the-Air (OTA) updates and upgrades.

2. The method of claim 1, wherein the verified ownership of the vehicle with the registered account includes:

positive comparison of at least one or more predetermined characteristics of the customer information, and one or more predetermined characteristics of the vehicle information with associated data in one or more authorized databases having known customer information and known vehicle information vehicle.

3. The method of claim 2, wherein the at least one or more predetermined characteristics of the customer information is a customer identification code and the one or more predetermined characteristics of the vehicle information is the vehicle identification number (VIN).

4. The method of claim 3, wherein the associated data in one or more authorized databases having known customer information and known vehicle information vehicle includes a secure customer information database having an active list of approved customer identification codes and includes a secure vehicle information database having an active list of available vehicles identifiable by VIN for approval or rejection for deactivation.

5. The method of claim 3, further including generating a report of data associated with the deactivation of the registered vehicle.

6. The method of claim 5, wherein the interactive interface includes:

a user interface for an in-vehicle computer,
a user interface for a smart phone,
a shared messaging service,
a web page,
a web-based hyperlink, and
an email requiring a response.

7. The method of claim 6, wherein the secure vehicle registration network includes one or more networked resources having at least one data source with vehicle information, dealer information, marketing information, and customer information, accessible by the authentication engine.

8. The method of claim 7, wherein the authentication engine is a remote server configured to provide secure communication with the vehicle to be registered and the registered user.

9. The method of claim 1, further including sending a wipe clean command to a vehicle to be deactivated thereby removing customer information from the vehicle which may be associated with present ownership.

10. The method of claim 1, further including sending a command to the vehicle after deactivation to display a welcome message with factory defaults for the subsequent owner of the vehicle.

11. The method of claim 10, further including updating one or more authorized databases having known customer information and known vehicle information vehicle to reflect subsequent ownership of the deactivated vehicle in an activated state with the subsequent owner as a new owner of the vehicle.

12. The method of claim 1, further including delinking the customer from accessing the interactive interface associated with the deactivated vehicle.

13. A system for use in an automotive sales network for deactivating a registered vehicle and delinking a customer associated with the registered vehicle to be deactivated via a secure vehicle registration network, comprising:

an interactive interface engine that provides an interactive interface to:
deactivate a registered vehicle, and
delink a registered customer account, wherein the interactive interface engine is capable of receiving and transmitting messages;

an authentication engine configured to:
receive a request from the interactive interface engine to deactivate the registered vehicle from the registered customer account,
verify ownership of the registered vehicle with the registered customer account from one or more authorized databases,
transmit verification of ownership of the registered vehicle with the registered customer account,
transfer a predetermined level of subscription services with the vehicle to a subsequent owner after deactivation of the registration of the vehicle from an original owner,
wherein the predetermined level of subscription services include at least one of: remote services of the vehicle or performance services of the vehicle,
wherein the remote services include at least one of: door lock/unlock, engine start, horn honk, flash lights, trunk open, cabin pre-conditioning, geofencing and speed alerts, or window control, and
wherein the performances services include Over-the-Air (OTA) updates and upgrades;

a secure communication system to facilitate communications with the one or more authorized databases, the vehicle, and the registered customer account;

a deactivation engine that in response to receiving the verification of ownership of the registered vehicle with the registered customer account from the authentication engine, deactivates the registered vehicle from the registered customer account including wiping customer data from the registered vehicle; and a reporting engine that generates one or more reports in response to receiving data from the authentication engine upon deactivation of the registered vehicle from the registered customer account by the deactivation engine.

14. The system of claim 13, wherein the interactive interface engine includes at least one of:

a user interface for an in-vehicle computer running an application on which at least some of the computer-executable instructions are executed, a user interface for a smart phone running the application on which at least some of the computer-executable instructions are executed, or a web page running the application on which at least some of the computer-executable instructions are executed.

15. A non-transitory computer-readable medium having stored thereon computer-executable instructions for deactivating a registered vehicle and delinking a customer associated with the registered vehicle to be deactivated via a secure vehicle registration network, the instructions, in response to execution, cause one or more processors to perform operations comprising:
- receiving, via an interactive interface, an instruction to deactivate the registered vehicle from the registered account;
- transmitting a deactivation request for the registered vehicle to an authentication engine;
- receiving verification of ownership of the registered vehicle with the registered account from the authentication engine;
- in response to receiving verification of ownership of the registered vehicle with the registered account from the authentication engine:
  - wiping the customer information associated with the ownership from the registered vehicle to be deactivated; and
  - deactivating the registered vehicle from the registered account; and
- transferring a predetermined level of subscription services with the vehicle to a subsequent owner after deactivation of the registration of the vehicle from an original owner,
  - wherein the predetermined level of subscription services include at least one of: remote services of the vehicle or performance services of the vehicle,
  - wherein the remote services include at least one of: door lock/unlock, engine start, horn honk, flash lights, trunk open, cabin pre-conditioning, geofencing and speed alerts, or window control, and
  - wherein the performances services include Over-the-Air (OTA) updates and upgrades.

16. The non-transitory computer-readable medium of claim 15, wherein the verified ownership of the vehicle with the registered account includes a positive comparison of at least one or more predetermined characteristics of the customer information and one or more predetermined characteristics of the vehicle information with associated data in one or more authorized databases having known customer information and known vehicle information vehicle.

17. The non-transitory computer-readable medium of claim 16, wherein the at least one or more predetermined characteristics of the customer information is a customer identification code and the one or more predetermined characteristics of the vehicle information is the vehicle identification number (VIN).

18. The non-transitory computer-readable medium of claim 17, wherein the associated data in one or more authorized databases having known customer information and known vehicle information vehicle includes a secure customer information database having an active list of approved customer identification codes and includes a secure vehicle information database having an active list of available vehicles identifiable by VIN for approval or rejection for deactivation.

19. The non-transitory computer-readable medium of claim 17, wherein the operations further comprise generating a report of data associated with the deactivation of a customer's registered vehicle.

20. The non-transitory computer-readable medium of claim 19, wherein the interactive interface includes at least one of:
- a user interface for an in-vehicle computer running an application on which at least some of the computer-executable instructions are executed,
- a user interface for a smart phone running the application on which at least some of the computer-executable instructions are executed, or
- a web page running the application on which at least some of the computer-executable instructions are executed.

21. The non-transitory computer-readable medium of claim 20, wherein the secure vehicle registration network includes one or more networked resources having at least one data source with vehicle information, dealer information, marketing information, and customer information, accessible by the authentication engine.

22. The non-transitory computer-readable medium of claim 21, wherein the authentication engine is a remote server configured to provide secure communication with the vehicle to be registered and an application on which at least some of the computer-executable instructions are executed, the registered user being logged onto the application.

23. The non-transitory computer-readable medium of claim 15, wherein the operations further comprise sending a wipe clean command to the vehicle to be deactivated including removing customer information from the vehicle which may be associated with present ownership.

24. The non-transitory computer-readable medium of claim 15, wherein the operations further comprise sending a command to the vehicle after deactivation to display a welcome message with factory defaults for the subsequent owner of the vehicle.

25. The non-transitory computer-readable medium of claim 24, wherein the operations further comprise updating one or more authorized databases having known customer information and known vehicle information vehicle to reflect subsequent ownership of the deactivated vehicle in an activated state with the subsequent owner as a new owner of the vehicle.

26. The non-transitory computer-readable medium of claim 15, wherein the operations further comprise prohibiting the customer from accessing the interactive interface associated with the deactivated vehicle.

* * * * *